United States Patent
Chumakov et al.

(10) Patent No.: US 8,598,579 B2
(45) Date of Patent: Dec. 3, 2013

(54) TEST STRUCTURE FOR ILD VOID TESTING AND CONTACT RESISTANCE MEASUREMENT IN A SEMICONDUCTOR DEVICE

(75) Inventors: Dmytro Chumakov, Dresden (DE); Dirk Utess, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 294 days.

(21) Appl. No.: 13/020,127

(22) Filed: Feb. 3, 2011

(65) Prior Publication Data

US 2012/0025862 A1 Feb. 2, 2012

(30) Foreign Application Priority Data

Jul. 30, 2010 (DE) .................. 10 2010 038 745

(51) Int. Cl.
- *H01L 23/58* (2006.01)
- *H01L 29/10* (2006.01)
- *H01L 23/48* (2006.01)
- *H01L 23/52* (2006.01)
- *H01L 29/40* (2006.01)
- *H01L 21/00* (2006.01)
- *H01L 21/66* (2006.01)
- *H01L 21/4763* (2006.01)
- *G01R 31/26* (2006.01)

(52) U.S. Cl.
USPC 257/48; 257/758; 257/E21.531; 257/E21.521; 438/11; 438/18; 438/622

(58) Field of Classification Search
USPC ............ 257/E21.021, E27.026, E23.01, 257/E23.011, E21.521, 48, 66, 528, 686, 257/754–755, 758, 734, 773–776; 438/4–5, 438/10–14, 17–18, 622, 625; 324/500, 525, 324/537, 719, 722, 750.3, 750.03, 756, 765, 324/766

See application file for complete search history.

(56) References Cited

U.S. PATENT DOCUMENTS

| | | | | |
|---|---|---|---|---|
| 5,262,719 A | * | 11/1993 | Magdo | 324/750.3 |
| 5,900,735 A | * | 5/1999 | Yamamoto | 324/537 |
| 5,986,283 A | * | 11/1999 | Bush et al. | 257/48 |
| 6,362,634 B1 | * | 3/2002 | Jarvis et al. | 324/719 |
| 6,822,330 B2 | * | 11/2004 | Park et al. | 257/758 |
| 7,598,615 B2 | * | 10/2009 | Lee et al. | 257/758 |
| 7,749,778 B2 | | 7/2010 | Chanda et al. | 438/17 |
| 2003/0020507 A1 | | 1/2003 | Song et al. | 324/763 |
| 2003/0222260 A1 | * | 12/2003 | Tone et al. | 257/48 |
| 2006/0138411 A1 | * | 6/2006 | Lachenmann et al. | 257/48 |
| 2009/0283764 A1 | | 11/2009 | Kim et al. | 257/48 |

OTHER PUBLICATIONS

Translation of Official Communication from German Patent Office for German Patent Application No. 10 2010 038 745.2 dated Mar. 9, 2011.

* cited by examiner

*Primary Examiner* — Mary Wilczewski
*Assistant Examiner* — Erik T Peterson
(74) *Attorney, Agent, or Firm* — Williams, Morgan & Amerson, P.C.

(57) ABSTRACT

In complex semiconductor devices, the contact characteristics may be efficiently determined on the basis of a test structure which includes a combination of interconnect chain structures and a comb structure including gate electrode structures. Consequently, an increased amount of measurement information may be obtained on the basis of a reduced overall floor space of the test structure. In this manner, the complex manufacturing sequence for forming a contact level of a semiconductor device may be quantitatively estimated and monitored.

16 Claims, 8 Drawing Sheets

TEST STRUCTURE FOR ILD VOID TESTING AND CONTACT RESISTANCE MEASUREMENT IN A SEMICONDUCTOR DEVICE

BACKGROUND OF THE INVENTION

1. Field of the Invention

The present disclosure generally relates to the field of semiconductor manufacturing, and, more particularly, to forming contact levels, and monitoring strategies for assessing the manufacturing sequence in view of, for instance, leakage paths, contact resistance and the like.

2. Description of the Related Art

Semiconductor devices, such as advanced integrated circuits, typically contain a great number of circuit elements, such as transistors, capacitors, resistors and the like, which are usually formed in a substantially planar configuration on an appropriate substrate having formed thereon a semiconductor layer. Due to the high number of circuit elements and the required complex layout of modern integrated circuits, the electrical connections of the individual circuit elements may generally not be established within the same level on which the circuit elements are manufactured, but require a plurality of additional "wiring" layers, which are also referred to as metallization layers. These metallization layers generally include metal-containing lines, providing the inner-level electrical connection, and also include a plurality of inter-level connections, which are also referred to as "vias," that are filled with an appropriate metal and provide the electrical connection between two neighboring stacked metallization layers.

Furthermore, the circuit elements are typically embedded in a dielectric material system, which provides the desired degree of passivation and robustness of the circuit elements prior to forming the complex metallization system. Hence, an appropriate contact regime or contact structure is implemented in the dielectric material system that passivates the circuit elements, and that will be also referred to herein as an interlayer dielectric material or material system. Due to the continuous shrinkage of the critical dimensions of the circuit elements, and thus due to the reduced lateral pitch of closely spaced circuit elements in the contact structure of the semiconductor device, which may be considered as an interface connecting the circuit elements of the device level with the metallization system, the critical dimensions in the contact structure have to be adapted to the reduced feature sizes in the device level and the metallization system. For this reason, very sophisticated patterning strategies may have to be applied in order to provide the contact elements with the required density and with appropriate reduced dimensions, at least at the device level side, in order to appropriately connect to the contact regions, such as drain and source regions, gate electrode structures and the like, without contributing to pronounced leakage current paths and even short circuits and the like. In many conventional approaches, the contact elements or contact plugs are typically formed by using a tungsten-based metal together with an interlayer dielectric stack that is typically comprised of silicon dioxide in combination with an etch stop material, such as a silicon nitride material. Due to the very reduced critical dimensions of the circuit elements, such as the transistors, the respective contact elements have to be formed on the basis of contact openings with an aspect ratio which may be as high as approximately 8:1 or more, wherein a diameter of the contact openings may be 0.1 µm or significantly less for transistor devices of, for instance, the 65 nm technology node. In even further sophisticated approaches, and in very densely packed device regions, the width of the contact openings may be 50 nm and less.

In recent developments, the contact level of sophisticated semiconductor devices may also be used for implementing additional mechanisms for enhancing performance of the transistor elements by inducing a desired type of strain in the active regions of the transistors. It is well known that, for a given crystallographic configuration of the active regions of the transistors, the generation of a specific type of strain, at least in the channel region, may have a significant effect on the resulting charge carrier mobility, i.e., on electrons or holes, thereby providing the possibility of increasing the drive current capability and the switching speed of the transistors for otherwise given transistor parameters. For example, for a standard configuration of a silicon material, i.e., a silicon material having a surface in the form of a (100) equivalent crystal plane with the current flow direction of the channel region oriented along a <110> equivalent crystallographic axis, a compressive strain may result in a significant increase of the mobility of holes, thereby enabling improvement in performance of P-channel transistors. Similarly, the generation of a tensile strain component in the channel region may result in an increase of the electron mobility, thereby providing superior performance of N-channel transistors. Since a strained silicon material in the channel region of field effect transistors may be considered as a "new" type of semiconductor material, without actually requiring new base materials and also allowing the application of many well-established process techniques, great efforts have been made in order to develop strain-inducing mechanisms with a high degree of compatibility with conventional transistor configurations. One promising approach that is frequently applied in sophisticated semiconductor devices is the incorporation of a highly stressed dielectric material into the interlayer dielectric material system, since at least the lower part of this material system is in close proximity to the gate electrode structures and the active region of the transistors, thereby enabling an efficient transfer of stress forces into the active region in order to create the desired strained state therein. As previously discussed, in a conventional interlayer dielectric material system, typically an etch stop material, for instance provided in the form of a silicon nitride material, may be applied in combination with the actual interlayer dielectric material, for instance in the form of a silicon dioxide material, thereby enabling the complex patterning sequence for forming contact openings having the desired reduced lateral dimensions, as explained above. Consequently, at least the etch stop material may be positioned in close proximity to the transistors and thus may represent an efficient source of creating a desired type of strain in at least some of the transistors. Therefore, in many approaches, the silicon nitride material of the etch stop layer may be formed so as to have a high internal stress level, which may then be efficiently transferred into the active region and may thus finally result in a desired type of strain in the channel region.

For example, plasma enhanced chemical vapor deposition (CVD) techniques have been developed in which process parameters are selected such that compressive stress levels of up to 3 GPa or even higher, or tensile stress levels of up to 2 GPa and higher, may be obtained. Since generally the internal stress level of the silicon nitride material in combination with the amount of material, i.e., the thickness of the etch stop layer, may significantly affect the finally obtained strain in the channel region, the process parameters are generally targeted so as to produce very high internal stress levels since the layer thickness is typically restricted by the complex surface topography in sophisticated semiconductor devices. For example, in densely packed device areas, gate electrode structures of minimum lateral dimensions may have to be positioned in close proximity to each other, thereby actually requiring deposition techniques with superior gap filling capabilities in order to reliably fill the spaces between the closely spaced gate electrode structures without creating deposition-related irregularities. It turns out, however, that desired high stress levels and superior gap filling capabilities upon depositing the silicon nitride material may not be compatible according to presently available deposition recipes so that corresponding irregularities may be generated, in particular in critical device areas having a very pronounced surface topography, wherein these irregularities may interact with the complex patterning process for forming contact elements, thereby resulting in significant yield losses of sophisticated semiconductor devices, as will be described in more detail with reference to FIGS. 1a-1e.

Figure 1A:
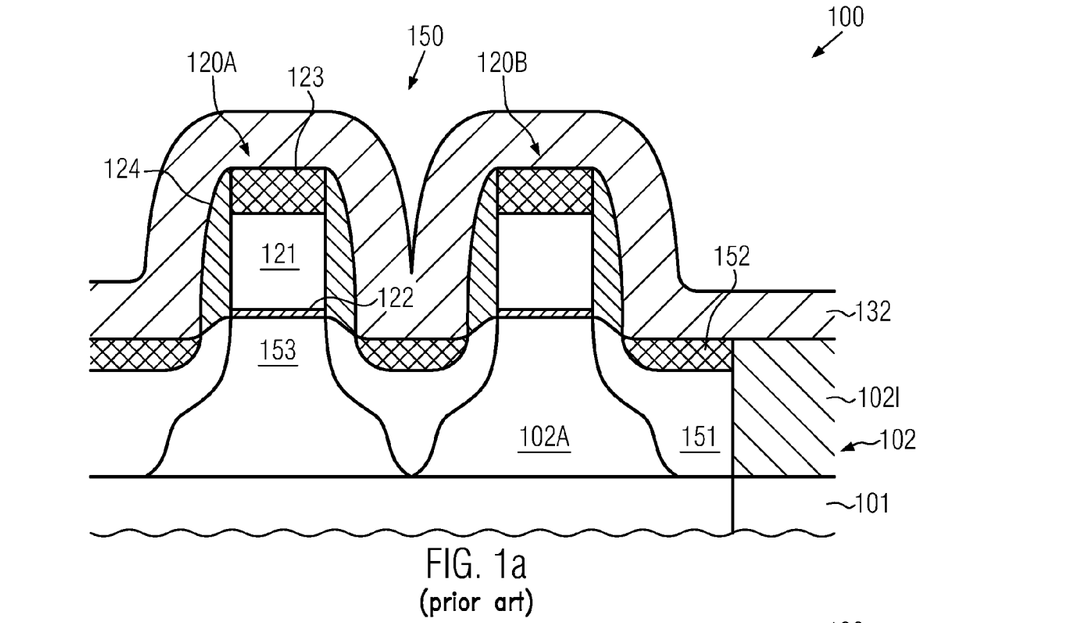
FIGS. 1a-1b schematically illustrate cross-sectional views of a semiconductor device with gate electrode structures formed above an active region (FIG. 1a) and above an isolation region (FIG. 1b), according to conventional process strategies.

FIG. 1a schematically illustrates a cross-sectional view of a semiconductor device 100 in an advanced manufacturing stage. As illustrated, the device 100 comprises a substrate 101 above which is provided a semiconductor layer 102, such as a silicon layer, which may form a bulk configuration or a silicon-on-insulator (SOI) configuration in combination with the substrate 101. That is, a bulk configuration is to be understood as a device architecture in which a crystalline semiconductor material of the substrate 101 may be in direct contact with the semiconductor layer 102, in and above which circuit elements, such as transistors, are to be formed. On the other hand, an SOI architecture is to be understood as a device configuration in which a buried insulating layer (not shown) may be formed below the semiconductor layer 102, thereby vertically bordering the semiconductor layer 102. Furthermore, in the manufacturing stage shown, the semiconductor layer 102 may not represent a continuous semiconductor material but may be divided into a plurality of active regions that are laterally delineated by an isolation region 102I, which may be substantially comprised of silicon dioxide and the like. An active region is to be understood as a semiconductor region in and above which at least one transistor is to be provided. For convenience, in FIG. 1a, a single active region 102A is illustrated, in and above which a plurality of transistors 150 are formed.

The transistors 150 comprise closely spaced gate electrode structures 120A, 120B which may have any appropriate configuration as required by the overall device architecture of the device 100. For example, as illustrated, the gate electrode structures 120A, 120B may comprise a gate dielectric material 122, such as a silicon oxide-based material, possibly in combination with a high-k dielectric material, which is to be understood as a dielectric material having a dielectric constant of 10.0 or higher and the like. Moreover, an electrode material 121, such as a metal-containing electrode material, a semiconductor material and the like, is typically provided, possibly in combination with a further electrode material 123, for instance provided in the form of a metal silicide material. Moreover, a sidewall spacer structure 124, which may comprise two or more individual spacer elements in combination with etch stop liners (not shown), may be provided on sidewalls of the electrode materials 121 and 123. As discussed above, the gate electrode structures 120A, 120B may have a length that is well beyond 100 nm, such as 50 nm and less in very sophisticated semiconductor devices. The gate length of the structures 120A, 120B is to be understood as the horizontal extension of the electrode material 121. Moreover, the transistors 150 may comprise drain and source regions 151 having any appropriate dopant concentration and profile as required by the general transistor characteristics. Furthermore, contact areas 152 may be provided in the drain and source regions 151, for instance in the form of a metal silicide and the like. Moreover, a channel region 153 is provided between the drain and source regions 151 and has a length that is substantially determined by the length of the gate electrode structures 120A, 120B and the horizontal dopant profile of the drain and source regions 151. As discussed above, the generation of a certain type of strain in the channel region 153 may significantly increase the conductivity thereof, thereby contributing to a superior performance of the transistors 150. For example, when the transistors 150 represent P-channel transistors, a compressive strain in the channel region 153, for instance along the current flow direction, i.e., along the horizontal direction in FIG. 1a, may provide a superior drive current capability of the transistors 150. To this end, a dielectric material 132, such as a silicon nitride material, is frequently provided so as to have a high internal stress level which may act on the gate electrode structures 120A, 120B and the active region 102A, thereby creating a desired type of strain in the channel region 153.

Figure 1B:
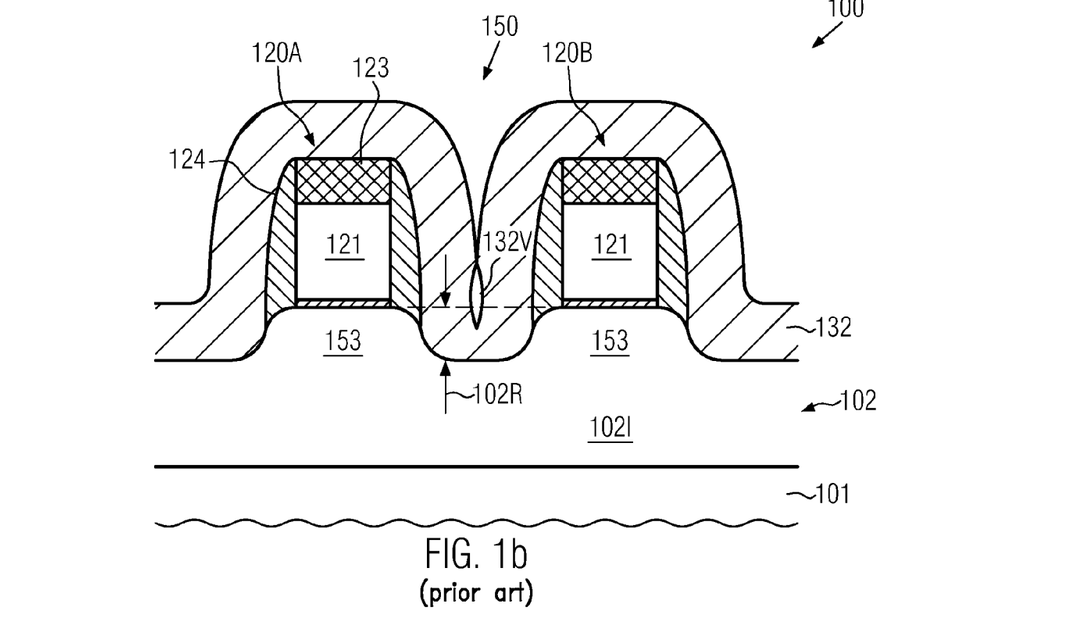

FIG. 1b schematically illustrates a cross-sectional view of the semiconductor device 100 in a device area that is laterally offset from the active region 102A of FIG. 1a. In the example shown, it may be assumed that the gate electrode structures 120A, 120B extend laterally beyond the active region 102A so that a portion thereof is formed on or above the isolation region 102I. Thus, the gate electrode structures 120A, 120B may have substantially the same configuration as described with reference to FIG. 1a, except for any differences caused by the different nature of the material of the isolation region 102I and the more pronounced surface topography created therein due to the preceding manufacturing sequence for forming the semiconductor device 100. As illustrated, pronounced recesses, as indicated by 102R, are formed in the isolation structure 102I which may be significantly more pronounced compared to any recessing in the active region 102A (FIG. 1a). Consequently, due to the very pronounced surface topography caused by the recesses 102R, the dielectric layer 132 may frequently comprise deposition-related irregularities, such as a void 132V, which may significantly affect the further processing of the device 100, as will be described later on in more detail.

Figure 1C:
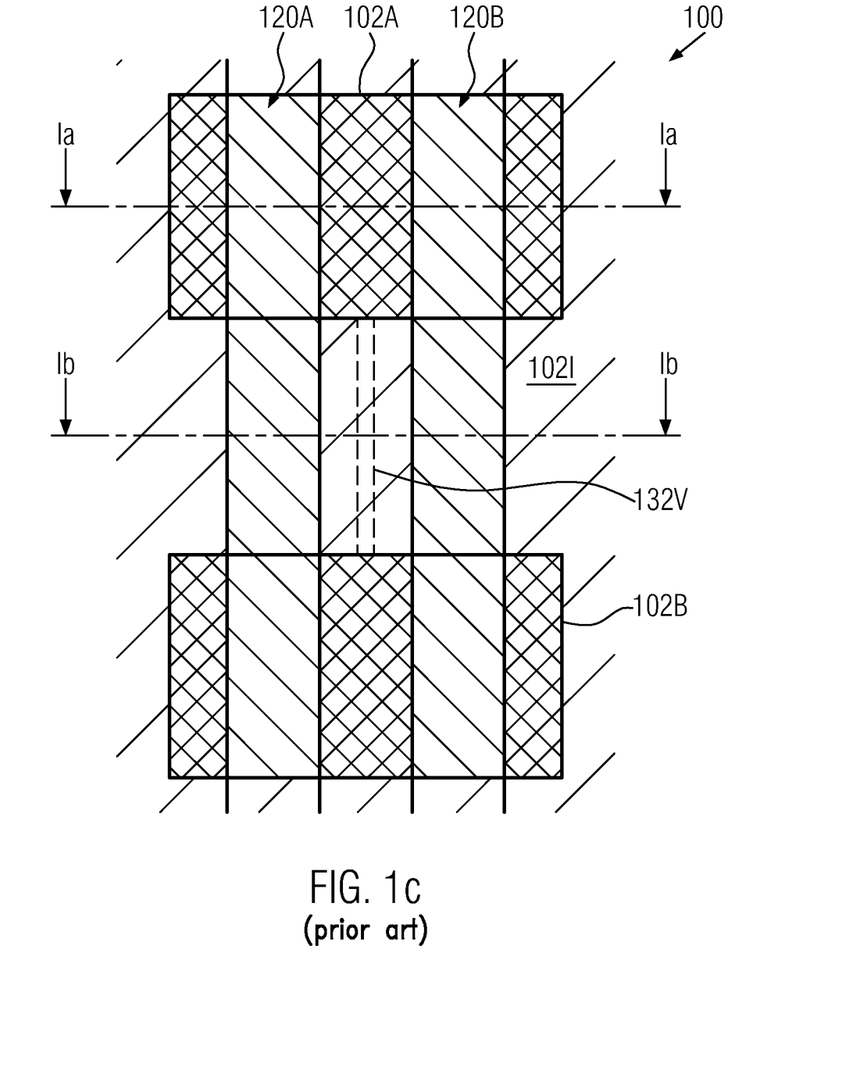
FIG. 1c schematically illustrates a top view of the semiconductor device as shown in FIGS. 1a and 1b.

FIG. 1c schematically illustrates a top view of the semiconductor device 100 according to the manufacturing stage as shown in FIGS. 1a and 1b. As illustrated, the active region 102A may be laterally delineated by the isolation region 102I, which in turn may laterally delineate a further active region 102B, as is also previously explained. The active regions 102A, 102B may correspond to transistors of the same conductivity type or to transistors of different conductivity type, depending on the circuit layout of the device 100. Moreover, in the example shown, it may be assumed that the gate electrode structures 120A, 120B may extend across the active region 102A, across a portion of the isolation region 102I and into or across the active region 102B. As indicated, the cross-section as shown in FIG. 1a may correspond to the section as indicted by Ia, while the cross-section of FIG. 1b may correspond to the section of the isolation region 102I, indicated by Ib. Consequently, in some cases, the void 132V may extend along the isolation region 102I from the active region 102A to the active region 102B.

The semiconductor device as shown in FIGS. 1a-1c may be formed on the basis of the following process strategies. The isolation region 102I is typically provided by applying sophisticated lithography techniques for forming appropriate trenches or recesses in the semiconductor layer 102 and refilling the recesses with an appropriate dielectric material, such as silicon dioxide. Thereafter, any excess material may be removed, for instance by chemical mechanical polishing (CMP) and etch techniques, and appropriate implantation processes in combination with masking regimes are applied in order to incorporate any desired well dopant species into the active regions 102A, 102B. Next, an appropriate material system is provided for the gate electrode structures 120A, 120B which may be accomplished on the basis of superior oxidation, deposition and patterning strategies, depending on the complexity of the resulting gate layer stack. For example, silicon oxide-based materials may be formed by oxidation and/or deposition, while any high-k dielectric materials, possibly in combination with conductive cap materials, may be provided on the basis of sophisticated deposition techniques, such as atomic layer deposition (ALD), CVD, sputter deposition and the like. Similarly, silicon material or any other semiconductor material may be provided by CVD techniques, in combination with any additional materials, such as dielectric cap materials (not shown), hard mask materials and the like. Thereafter, a complex patterning sequence is applied in order to pattern the electrode materials 121 and possibly any other additional materials so as to have the desired critical dimensions, which may be 100 nm and significantly less, such as 50 nm and less. Thereafter, a portion of the spacer structure 124 may be formed and drain and source dopant species may be incorporated into the active regions 102A, 102B as required. Thereafter, the spacer structure 124 may be completed and any additional drain and source dopant implants may be introduced, followed by any anneal processes, in order to adjust the final horizontal and vertical dopant profile and to reduce implantation-induced damage. Next, the contact areas or metal silicide regions 152 may be formed, if required, for instance by depositing a refractory metal, such as nickel, platinum and the like, and initiating a chemical reaction to obtain the desired metal silicide. In this stage, the metal silicide 123 may also be provided in the gate electrode structures 120A, 120B.

It should be appreciated that, during the entire complex process sequence, a plurality of sophisticated cleaning processes and etch processes are required, which may result in a more or less pronounced loss of materials in the active regions 102A, 102B and in a more pronounced manner in the isolation region 102I. For example, before and/or after any critical processes, typically, efficient cleaning recipes may have to be applied, wherein, frequently, chemistries, such as hydrofluoric acid and the like, may be applied in order to remove contaminants and the like. In any such reactive processes, a significant portion of material of the isolation region 102I may also be removed, thereby increasingly contributing to the pronounced recesses 102R (FIG. 1b). For example, also prior to forming the metal silicide regions 152 (FIG. 1a), a pronounced cleaning process may be required in order to prepare exposed surface portions of the active regions 102A, 102B (FIG. 1c) for the subsequent silicidation process. Moreover, in many sophisticated approaches, additional strain-inducing mechanisms are implemented, for instance by providing a strain-inducing semiconductor material (not shown) in a portion of active regions, for instance by providing a silicon/germanium material in the drain and source areas of the transistors, so that the strained silicon/germanium material may also apply a desired compressive strain in the channel region. Also in this case, additional etch and cleaning processes are required, which may result in an even more pronounced surface topography of the isolation region 102I, when laterally delineating the active region of P-channel transistors.

Consequently, upon depositing the dielectric material 132 with a high internal stress level, typically, process parameters are selected such that a desired high amount of material may be positioned on the active region 102A (FIG. 1a) and thus also between the closely spaced gate electrode structures 120A, 120B. In this case, the deposition process for forming the layer 132 may result in the void 132V between the gate electrode structures 120A, 120B above the isolation region 102I due to the pronounced recess 102R, since a significantly increased aspect ratio is "seen" by the deposition process locally above the isolation structure 102I.

Figure 1D:
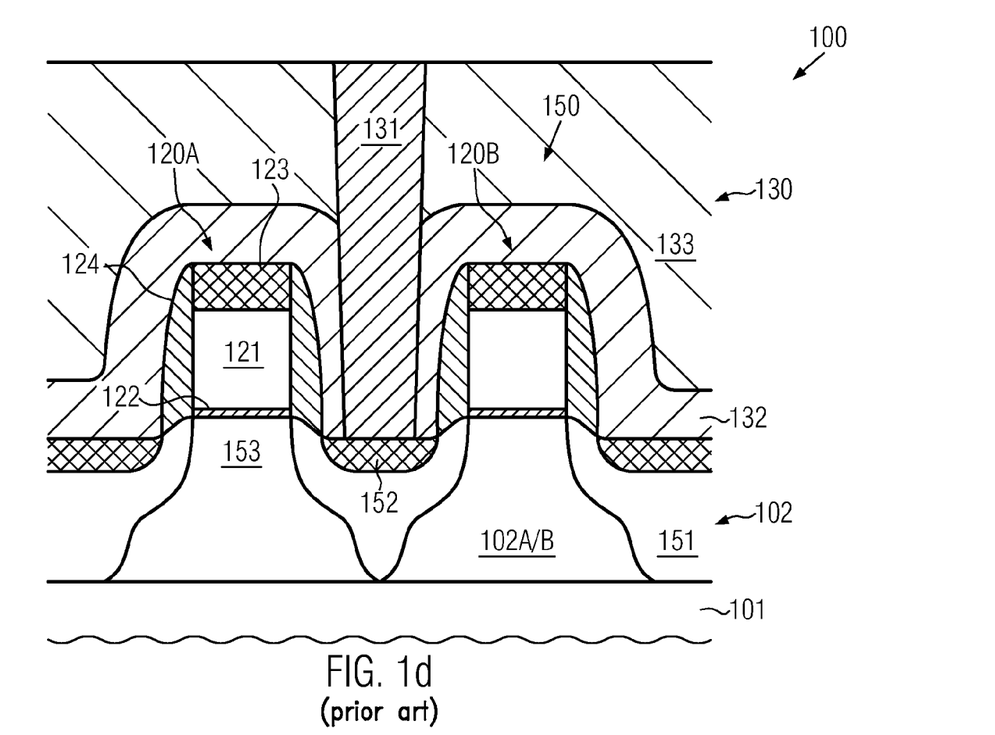
FIG. 1d schematically illustrates a cross-sectional view of the semiconductor device in a further advanced manufacturing stage in which a sophisticated contact element may be provided.

FIG. 1d schematically illustrates the semiconductor device 100 in a further advanced manufacturing stage. As illustrated, a further dielectric material 133, for instance in the form of a silicon dioxide material, is provided, thereby forming, in combination with the layer 132, an interlayer dielectric material system 130. Furthermore, a contact element 131 is formed in the system 130 so as to connect to the active regions 102A and/or 102B by connecting to the contact area 152. The material 133 may typically be provided on the basis of well-established deposition techniques, such as high density plasma CVD, sub-atmospheric CVD and the like, in order to provide the material 133 with the required chemical and mechanical characteristics, while these deposition techniques may also provide high deposition rates and a superior gap filling behavior. After the deposition of the material 133, the surface thereof may be planarized, for instance by CMP, in order to provide superior conditions for the subsequent complex patterning strategy for forming the contact element 131. To this end, an appropriate etch mask may be formed on the basis of sophisticated lithography techniques, which may involve the deposition of hard mask materials and the like, followed by a complex etch step for etching through the material 133, while using the material 132 as an etch stop material. Thereafter, a different etch chemistry may be applied so as to etch through the layer 132 to connect to the area 152. Thereafter, appropriate deposition recipes may be applied so as to fill the contact opening with an appropriate contact metal, such as tungsten, followed by the removal of any excess material, for instance by CMP, thereby providing the electrically isolated contact element 131. The deposition of the tungsten material may typically be accomplished on the basis of CVD techniques, possibly in combination with the deposition of appropriate barrier and seed materials, wherein, however, a significant deposition may also occur in the void 132V (FIG. 1c) when the preceding process for forming the contact opening may also connect to the void 132V. For example, by a slight misalignment of the contact openings, the void 132V may extend into the active regions 102A, 102B and a "buried" channel is created, which may be filled, at least partially, with the contact material upon filling the contact openings.

Figure 1E:
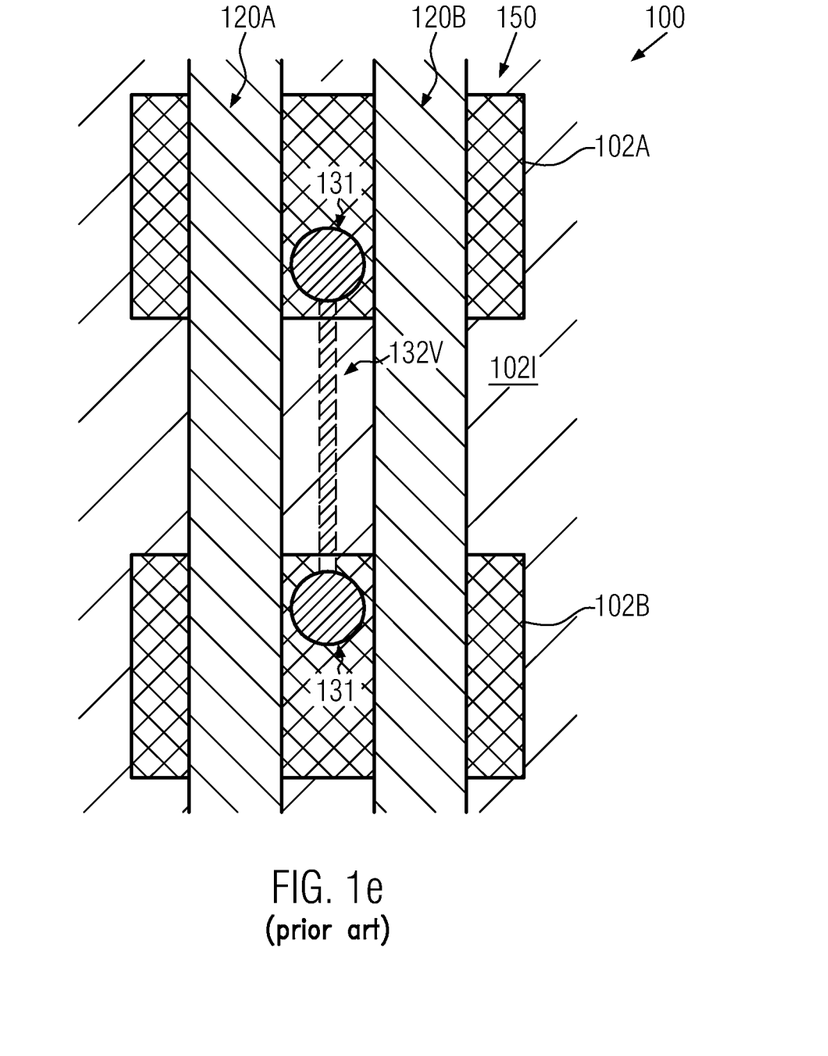
FIG. 1e schematically illustrates a top view of the semiconductor device according to a manufacturing stage as shown in FIG. 1d, wherein a high risk for creating leakage paths between adjacent contact elements may exist due to the complex overall device layout.

FIG. 1e schematically illustrates a top view of the semiconductor device 100 according to a manufacturing stage as shown in FIG. 1d. As illustrated, the contact elements 131 may be provided in the active regions 102A, 102B, wherein the void 132V may also have incorporated therein a conductive material, thereby creating a leakage path which may even result in a short circuit of the active regions 102A and 102B. Consequently, by applying the manufacturing strategy as described above, a significant probability may exist to form unwanted leakage paths caused by the interlayer dielectric material system 130 (FIG. 1d), which may result in significant yield loss, in particular when highly scaled semiconductor devices are considered. The situation becomes even worse when even more sophisticated approaches are used for implementing strain-inducing mechanisms into the interlayer dielectric material system 130 (FIG. 1d), for instance by applying layers of different types of stresses in order to selectively improve performance of N-channel transistors and P-channel transistors, thereby requiring the deposition of one or more additional stressed material layers and the removal of any unwanted portions thereof, which may contribute to even more pronounced patterning-related irregularities.

As previously discussed, any leakage paths between the gate electrode structures and the contact element, as well as any buried conductive channels and short circuits, may result in significant yield losses and significantly reduced reliability of the semiconductor device upon operation, so that, typically, thorough monitoring of the processes and the process results may be required during the complex sequence of manufacturing processes. To this end, in some conventional approaches, appropriate test structures are implemented into the semiconductor substrate, for instance in scribe lines and the like, while, in other cases, even dedicated locations within an actual die region may be reserved for providing appropriate test structures for evaluating the process results of the complex manufacturing strategies. For example, the leakage currents and dielectric characteristics of the interlayer dielectric material system may frequently be monitored by providing a comb-like structure of gate electrode structures, wherein an appropriate contact regime may allow access to the comb-like structure and to apply appropriate voltages across the comb-like structure in order to estimate the dielectric characteristics and the leakage behavior. In this manner, the presence of excessive leakage paths, for instance caused by any buried channels, as described above, may also be detected on the basis of any such comb-like gate electrode structures. Similarly, overall contact resistivity may be determined on the basis of providing contact chains, i.e., conductive interconnect structures in which a plurality of contact elements in combination with metal lines and active semiconductor regions may be used in order to determine contact resistivity and contact failures, wherein a moderately high number of contact elements may provide statistically significant measurement results. Thus, any such chain structures may also be provided in dedicated test areas, in combination with an appropriate contact regime, in order to access the test structure on the basis of any external test equipment at an appropriate stage of the overall manufacturing process.

Due to the increasing degree of complexity of sophisticated semiconductor devices, however, the available real estate for providing dedicated test structures may be restricted, while at the same time the increasing complexity of the overall process sequence may require a greater number of specifically designed test structures. Consequently, in particular, chip-internal test structures may not be available in a desired number, although the corresponding electrical measurement data may provide superior authenticity compared to test structures provided in the frame area of the semiconductor device, since here different process conditions may be encountered, for instance caused by a different surface topography and the like, which may also result in subtle variations of a corresponding process result involved in the fabrication of complex semiconductor devices.

The present disclosure is directed to various devices and techniques that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices, test structures implemented therein and manufacturing techniques in which an increased amount of measurement data may be obtained from a given available area of the semiconductor device, in particular with respect to highly complex manufacturing processes, such as the formation of sophisticated transistor elements in combination with a complex contact regime. To this end, an appropriate test regime may be applied in which chain-like structures comprising a plurality of "vertical" interconnect elements, which may also be referred to herein as inter-level contact elements, for instance in the form of contact elements connecting semiconductor-based circuit elements with the very first layer of a metallization system, or vias, which may provide the electrical contact between two adjacent metallization layers. Additionally, an appropriate line structure may be implemented into the test area so as to provide a similar device geometry as in critical densely packed device regions, while at the same time enabling the assessment of an interaction with the chain-like interconnect structure. In some illustrative embodiments disclosed herein, the conductive lines may be provided in the form of a comb-like structure, for instance comprising a plurality of gate electrode structures or metal lines, depending on the device levels considered, wherein the chain-like interconnect structure and comb-like structure may be appropriately superimposed, i.e., these structures may cross each other, thereby providing a plurality of "interaction" positions from which valuable electrical measurement data may be obtained, for instance in the form of leakage current information, resistance and the like.

One illustrative semiconductor device disclosed herein comprises a first interconnect chain structure formed in a first device level and a second device level, wherein the first interconnect chain structure comprises a first plurality of lower conductive regions formed in the first device level and a first plurality of upper conductive regions formed in the second device level. Moreover, the first interconnect chain structure comprises a first plurality of inter-level connections connecting the first plurality of lower conductive regions with the first plurality of upper conductive regions. The semiconductor device further comprises a second interconnect chain structure formed in the first and second device levels and comprising a second plurality of lower conductive regions formed in the first device level, a second plurality of upper conductive regions formed in the second device level and a second plurality of inter-level connections that connect the second plurality of lower conductive regions with the second plurality of upper conductive regions. Additionally, the semiconductor device comprises a conductive comb structure formed between the first and second device levels and comprising a plurality of conductive lines crossing the first and second interconnect chain structures.

One illustrative test structure in a semiconductor device disclosed herein comprises a plurality of semiconductor regions formed in a semiconductor layer and being laterally delineated by an isolation region. The test structure further comprises an interlayer dielectric material system formed above the plurality of semiconductor regions and the isolation region. Furthermore, the test structure comprises a plurality of conductive lines embedded in the interlayer dielectric material system and extending in parallel at least above the isolation region. Additionally, the test structure comprises a plurality of contact elements formed in the interlayer dielectric material system and connecting to the plurality of semiconductor regions. Furthermore, the test structure comprises a metallization system formed above the interlayer dielectric material system and comprising a plurality of metal lines that connect to the plurality of contact elements so as to form at least one interconnect chain structure that is oriented perpendicularly to the plurality of conductive lines.

One illustrative method disclosed herein relates to obtaining electrical measurement data from a semiconductor device. The method comprises supplying a first test voltage to an interconnect chain structure that is formed in a first device level and a second device level. The method further comprises determining a first measurement value based on the first test voltage, wherein the first measurement value indicates a resistance of the interconnect chain structure. The method further comprises supplying a second test voltage to the interconnect chain structure and a conductive comb structure, which comprises a plurality of parallel conductive lines crossing the interconnect chain structure. Additionally, the method comprises determining a second measurement value based on the second test voltage.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and a test structure implemented therein which may be used for obtaining a greater amount of information from a given area of the test structure by appropriately combining chain-like interconnect structures with conductive line structures having a plurality of parallel conductive lines, for instance provided in the form of a comb-like structure. To this end, at least one interconnect chain structure, for instance comprising two or more branches, may be superimposed on a comb structure so as to obtain a plurality of interaction points, which may thus provide statistically meaningful electrical measurement data, while also enabling the usage of a similar device geometry as compared to critical device areas. In some illustrative embodiments disclosed herein, the test structure may be formed within the semiconductor material of the device as a first device level and within the very first metallization layer as a second device level, wherein contact elements may provide the inter-level connection between the first and second device levels, thereby providing the possibility of assessing the characteristics of complex contact levels of semiconductor devices, for instance in view of any type of contact failures, as for instance also described above with reference to FIGS. 1a-1e. Consequently, in this case, generally, the contact resistivity of sophisticated contact elements, for instance having lateral dimensions of 50 nm and less, may be evaluated, and thus the corresponding efficiency of the associated manufacturing processes may be monitored, wherein a moderately high density of contact elements may be established on the basis of a device geometry, which may be comparable to the device geometry as previously discussed. Furthermore, the presence of any leakage paths may be efficiently detected, for instance with respect to any buried channels, which may typically occur in sophisticated interlayer dielectric material systems, for instance when comprising one or more highly stressed dielectric materials, as is also previously discussed. Furthermore, due to the implementation of a comb-like structure, for instance in the form of "gate electrode structures," any valuable information may also be obtained, for instance with respect to leakage currents between gate electrode structures and contact elements, dielectric breakdown characteristics of gate electrode structures and the like.

Moreover, in some illustrative embodiments, the semiconductor regions provided in the first device level may be provided in the form of inversely doped semiconductor regions, for instance P-type regions and N-type regions, which may be used in dedicated interconnect chains, thereby also allowing the evaluation of the various types of active regions to be used in complex semiconductor devices. In some illustrative embodiments, a high density of contact elements may be obtained so that some of the conductive lines of the comb structure may extend across corresponding active regions, thereby enabling the implementation of transistor-like structures, which may be efficiently used for controllably discontinuing a conductive path in one or more of the interconnect chain structures, thereby providing superior flexibility in applying appropriate measurement strategies. For example, upon implementing at least one transistor-like structure into each of the interconnect chain structures, the same test voltage may be applied to two or more interconnect chain structures, while nevertheless providing the possibility of individually determining the contact resistance by appropriately controlling the corresponding transistor-like structures. In this manner, the number of contact pads required for electrically accessing the structure may be reduced, thereby also contributing to a reduced area required for implementing the test structure.

With reference to FIGS. 2a-2d further illustrative embodiments will now be described in more detail, wherein reference may also be made to FIGS. 1a-1e, in particular when referring to device characteristics and manufacturing techniques associated therewith.

Figure 2A:
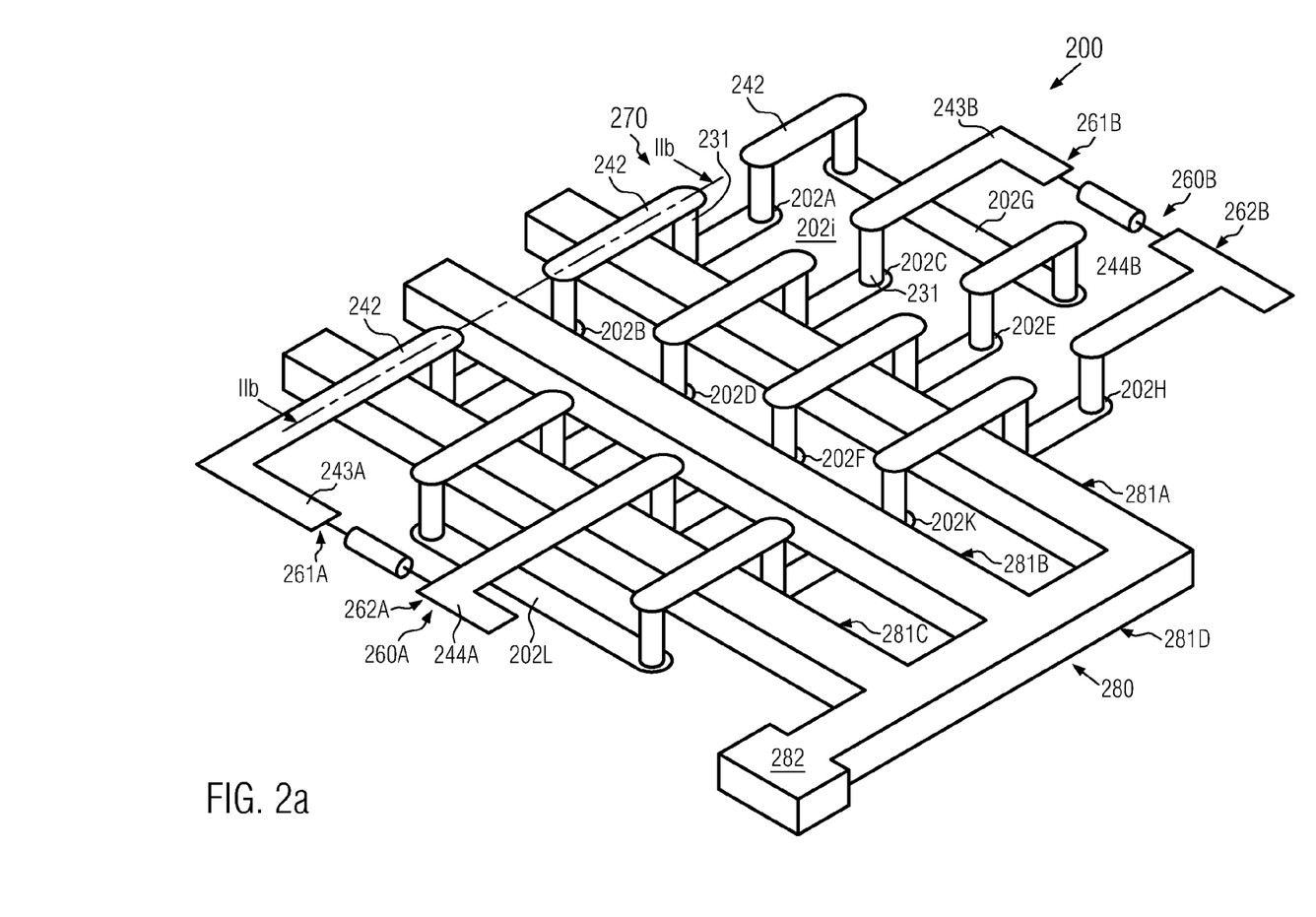
FIG. 2a schematically illustrates a perspective view of a test structure, which may be implemented in a semiconductor die region or in a frame region of semiconductor devices, wherein a combined chain structure and comb structure may provide superior information density with respect to evaluating a complex manufacturing process, for instance as described above with reference to FIGS. 1a-1e, according to illustrative embodiments.

FIG. 2a schematically illustrates a perspective view of a semiconductor device 200 in an advanced manufacturing stage. As illustrated, the semiconductor device 200 may comprise a test structure 270, which may be formed at any appropriate position in the semiconductor device 200. For example, the test structure 270 may be formed within a die region, i.e., within a portion of a semiconductor substrate, in and above which functional circuit portions are formed in accordance with the electrical configuration of the device 200. In other cases, the test structure 270 may be provided in dedicated positions outside of a die region, for instance in a frame region, provided between adjacent semiconductor chips. In other cases, the test structure 270 may be provided in a die region together with other test structures without actually requiring the provision of any actual functional circuit portions. The test structure 270 may be implemented in two different device levels, as will be described later on in more detail with reference to the cross-sectional view of FIG. 2b, in order to implement a plurality of vertical or inter-level contact elements, for instance for connecting between semiconductor regions and the very first metallization layer through a complex interlayer contact material system, as is discussed above with reference to FIGS. 1a-1e. In other cases, the test structure 270 may be implemented in two adjacent metallization layers of a metallization system. The test structure 270 may comprise one or more interconnect chain structures 260A, 260B, wherein a chain structure is generally to be understood as a conductive structure formed by a plurality of conductive regions provided in the first device level and a plurality of conductive regions provided in the second device level, which are appropriately connected by the inter-level contact elements in order to provide a continuous conductive path. In the embodiment shown, the interconnect chain structure 260A may comprise a plurality of semiconductor regions 202A, 202B which may, for instance, be part of a first branch 261A of the interconnect chain 260A. Similarly, active regions 202E, 202F may also be a part of the interconnect chain 260A and may further be a part of a branch 262A, wherein generally the branches 261A, 262A may be parallel to each other and may be connected, for instance by a semiconductor region 202G.

It should be appreciated that, in some illustrative embodiments (not shown), a single interconnect chain structure comprising two or more branches may be provided in the test structure 270, while, in other illustrative embodiments, as shown, at least one second interconnect chain, such as the chain 260B, may be provided, thereby providing an increased amount of leakage current information, while, in other cases, i.e., by providing a single interconnect chain, superior statistical relevance, for instance with respect to contact resistance and the like, may be provided for a given area of the test structure 270. The interconnect chain structure 260B may have a similar configuration as the structure 260A and may comprise a plurality of active regions 202C, 202D provided in a first branch 261B, while a plurality of active regions 202H, 202K may be part of a second branch 262B, wherein the branches 261B, 262B may be connected by a semiconductor region 202L. The active regions 202A . . . 202L may be provided in a semiconductor layer and may be laterally delineated by an isolation region 202I, such as a shallow trench isolation, as is also previously discussed with reference to the semiconductor device 100. Furthermore, the interconnect chain structures 260A, 260B may comprise metal regions 242 which may be provided in the very first metallization layer of a metallization system, as will be described later on in more detail. Furthermore, elements 231 may be provided so as to connect the plurality of active regions 202A . . . 202L with the plurality of metal regions 242 through an interlayer dielectric material system (not shown) having any appropriate configuration, as is for instance also described above with reference to the semiconductor device 100. Consequently, a conductive path may be established in the interconnect chain structure 260A by means of the plurality of semiconductor regions 202A, 202B, 202G, 202E, 202R, the associated contact elements 231 and the corresponding metal regions 242, wherein appropriate contacts 243A, 244A may also be provided in order to enable electrical access of the interconnect chain structure 260A by means of electrical probes and the like.

Moreover, in some illustrative embodiments, the semiconductor regions provided in the first device level may be provided in the form of inversely doped semiconductor regions, for instance P-type regions and N-type regions, which may be used in dedicated interconnect chains, thereby also allowing the evaluation of the various types of active regions to be used in complex semiconductor devices. In some illustrative embodiments, a high density of contact elements may be obtained so that some of the conductive lines of the comb structure may extend across corresponding active regions, thereby enabling the implementation of transistor-like structures, which may be efficiently used for controllably discontinuing a conductive path in one or more of the interconnect chain structures, thereby providing superior flexibility in applying appropriate measurement strategies. For example, upon implementing at least one transistor-like structure into each of the interconnect chain structures, the same test voltage may be applied to two or more interconnect chain structures while nevertheless providing the possibility of individually determining the contact resistance by appropriately controlling the corresponding transistor-like structures. In this manner, the number of contact pads required for electrically accessing the structure may be reduced, thereby also contributing to a reduced area required for implementing the test structure.

Similarly, the interconnect chain structure 260B may represent a conductive path on the basis of the active regions 202C, 202D, 202L, 202K, 202H and the corresponding contact elements 231 in combination with the associated metal regions 242, wherein appropriate contacts 243B, 244B may also be provided.

Furthermore, the test structure 270 may comprise a plurality of substantially parallel conductive lines 281A, 281B, 281C which may be oriented substantially "perpendicularly" to the chain branches 261A, 261B, 262A, 262B thereby crossing these chain branches. Moreover, as shown, the plurality of conductive line structures 281A, 281B, 281C may commonly connect to a conductive line 281D, thereby forming a comb structure 280. In some illustrative embodiments, the conductive lines 281A, 281B, 281C may represent lines having the same configuration as gate electrode structures of the semiconductor device 200, while, in other cases, when the test structure 270 may be provided in two adjacent metallization layers, the lines 281A, 281B, 281C may be formed in the same device level as the plurality of conductive regions 202A . . . 202L. Furthermore, a contact area 282 may be provided so as to connect to the line 281D and thus to the plurality of lines 281A, 281B, 281C.

Figure 2B:
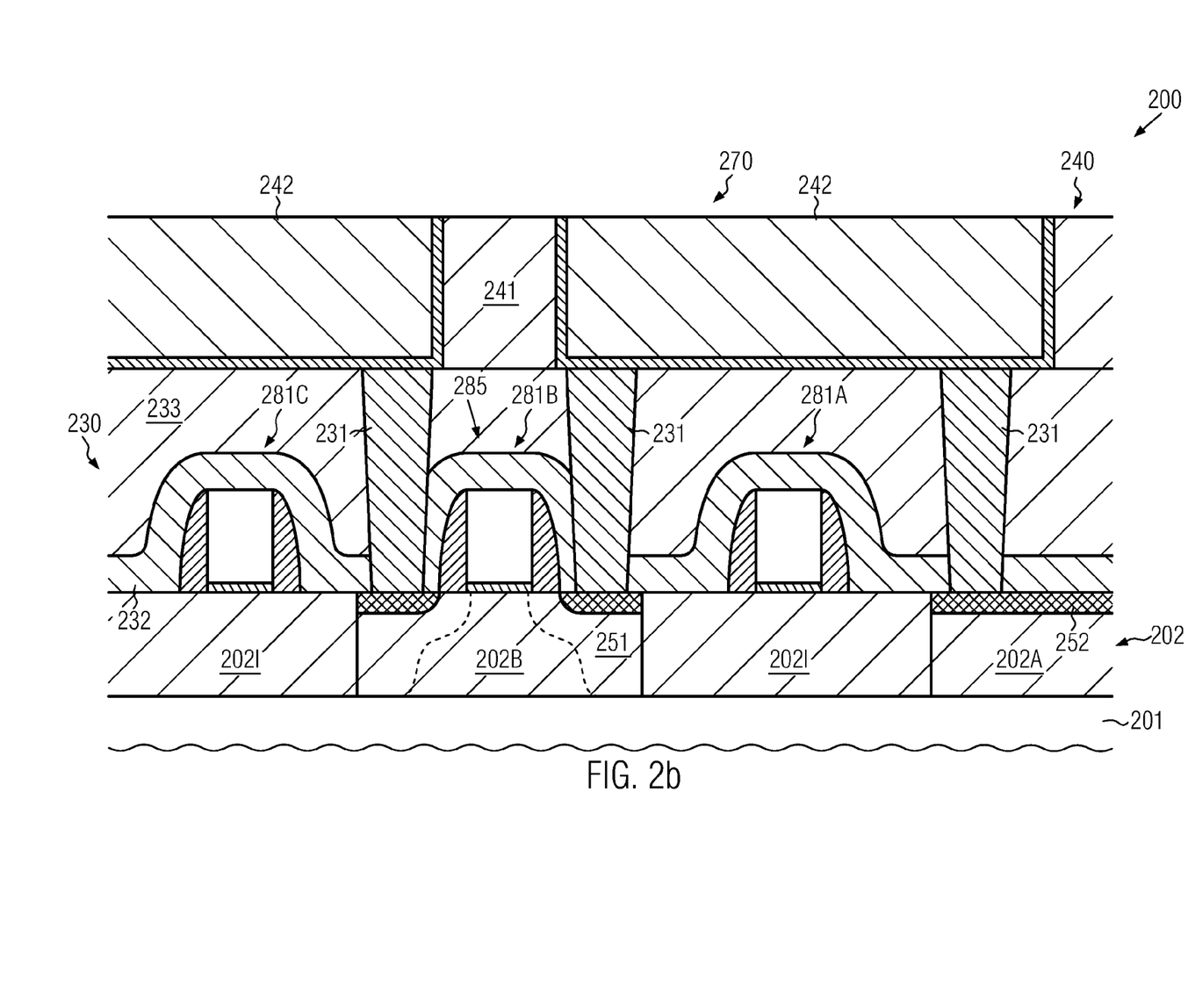
FIG. 2b schematically illustrates a cross-sectional view along the line IIb of FIG. 2a, according to illustrative embodiments.

FIG. 2b schematically illustrates a cross-sectional view of the semiconductor device 200 according to the section IIb in FIG. 2a. As illustrated, the semiconductor device 200 may comprise a substrate 201 above which may be formed a semiconductor layer 202, wherein the substrate 201 and the semiconductor layer 202 may have any appropriate configuration, for example as also discussed above with reference to the device 100. Thus, the semiconductor layer 202 may initially be provided as any appropriate semiconductor material and may be divided into a plurality of semiconductor regions by the isolation structure 2021. Furthermore, in the manufacturing stage shown, the semiconductor regions 202A, 202B and also any other semiconductor regions, may comprise contact areas, for instance provided in the form of a metal silicide 252, wherein the degree of coverage by a metal silicide in each of the active regions 202A . . . 202L may depend on the presence of an overlying conductive line, such as the lines 281A, 281B, 281C. For example, for the configuration shown in FIGS. 2a and 2b, the active region 202A may be substantially completely covered by a metal silicide. It should be appreciated, however, that any other configuration may be used, depending on the overall process and device requirements. For instance, in some approaches, metal silicides may be formed in a late manufacturing stage, i.e., upon forming the contact elements 231, thereby providing a metal silicide in an area connecting to the underlying semiconductor region so that the size and position of corresponding metal silicide regions may be defined by the position and size of the contact elements 231. Furthermore, the semiconductor regions 202A . . . 202L may have any appropriate dopant concentration implemented therein in order to provide a desired conductive path and also to comply with the desired degree of authenticity with respect to actual device areas. For example, the dopant concentration in the active regions 202A . . . 202L may be incorporated on the basis of manufacturing techniques in which transistor elements may also be formed, as is also previously discussed with reference to the semiconductor device 100. In this case, a desired well dopant species may be implemented in a very early manufacturing stage, thereby, for instance, defining the basic conductivity type of the active region under consideration. After forming any gate electrode structures and thus the conductive lines 281A, 28A, 281C, drain and source dopant species may be incorporated on the basis of any appropriate masking regime and implantation techniques, thereby providing a moderately high dopant concentration, for instance in the non-covered active region 202A. On the other hand, highly doped regions 251 may be formed in the active region 202B, above which is formed the conductive line 281B, which may in combination with any spacer structures and the like act as an implantation mask, as is also previously explained. Consequently, the active region 202B in combination with the conductive line 281B may have a transistor-like configuration in some illustrative embodiments, which may be used for controlling the current flow in the interconnect chain structure 260A (FIG. 2a). For example, the active regions 202A, 202B may be provided so as to obtain a desired well dopant species, for instance in the form of an N-type species or a P-type species, while the high dopant concentration applied in a later manufacturing stage may be of inverse conductivity type, for instance as typically used in the formation of sophisticated field effect transistors. Consequently, in this case, an efficient P-channel transistor or N-channel transistor may be implemented in and above the active region 202B, while, on the other hand, the active region 202A may receive a high dopant concentration, thereby establishing a highly conductive path within the active region 202A.

In the implementation of the highly doped regions 251, if drain and source-like PN junctions may be considered inappropriate, the implantation sequence may be appropriately designed such that a desired high dopant concentration may also be implemented continuously in the active region 202B, for instance during a specifically masked "well" implantation step, which may provide a desired high dopant concentration, wherein any subsequent drain and source implantation processes may incorporate the same type of dopant species, which may thus result in a continuous conductive path in the active region 202B.

Moreover, in the manufacturing stage shown, an interlayer dielectric material system 230 may be provided, thereby embedding the line structures 281A, 281B, 281C, which, as discussed above, may have substantially the same configuration as any gate electrode structures to be formed in actual device areas of the device 200. For example, the line structures 281A, 281B, 281C may be formed in accordance with manufacturing techniques as, for instance, described above with reference to the gate electrode structures 120A, 120B, while also similar critical dimensions may be applied. In this manner, the conductive lines 281A, 281B, 281C, that is, the comb structure 280 of FIG. 2a, may provide a similar device geometry as is also previously discussed, which may result in significant leakage paths as also discussed above.

For example, the interlayer dielectric material system 230 may be formed so as to comprise at least one stress-inducing material, as explained before, for instance in the form of an etch stop layer 232, which may have a desired type of stress, at least in some device areas, while, in other approaches, the layer 232 may be provided with different types of internal stress, for instance based on sophisticated dual stress liner approaches. Furthermore, at least one further dielectric material 233, such as silicon dioxide, may be provided. Generally, the interlayer dielectric material system 230 may be formed on the basis of manufacturing techniques as also discussed above. It should be appreciated that, as described above in more detail, the manufacturing processes for forming the semiconductor device 200 may result in a pronounced surface topography, in particular in the isolation region 202I (not shown), which may thus increase the probability of creating buried channels and the like. For convenience, any such process-related irregularities are not shown in FIG. 2b. Furthermore, the contact elements 231 may be provided so as to comply with the design requirements of the test structure 270, wherein, typically, appropriate design criteria may be used, as are also used in actual device areas in order to enhance the authenticity of the corresponding measurement data, since, by using very similar design criteria for the test structure 270 compared to actual device areas, very similar process conditions may also be established and thus the test structure 270 may represent any actual device features with a high degree of authenticity. For example, as previously discussed, the contact elements 231 may be provided in the form of sophisticated elements whose lateral dimensions are adapted to the complex circuit elements formed in and above the layer 202. Furthermore, the device 200 may comprise a metallization system 240 wherein, for convenience, a very first metallization layer thereof is illustrated in FIG. 2b. It should be understood, however, that typically a plurality of stacked metallization layers are required in order to establish the electrical connections for the device 200. The metallization system 240 may comprise an appropriate dielectric material 241, such as a low-k dielectric material, an ultra low-k dielectric material and the like in which the metal regions 242 are laterally embedded so as to appropriately connect to the contact elements 231. For example, the metal regions 242 may be comprised of copper in combination with appropriate barrier materials and the like, as is typically required in complex metallization systems. It should be appreciated that, in forming the metallization system 240, also the contacts 243A, 243B, 244A, 244B (FIG. 2a) may be provided, wherein it should be understood that these contacts may be provided at any appropriate device level within the metallization system 240 so as to allow electrical access by external test equipment at any appropriate manufacturing stage.

The test structure 270 may thus comprise the active regions 202A, 202B and also any other active regions, as shown in FIG. 2a, within the semiconductor layer 202, which may thus represent the first device level. Moreover, the metallization system 240, such as the very first metallization layer, may represent the second device level of the test structure 270 in which the metal regions 242 may be provided, while the contact elements 231 may provide the inter-level connection between the levels 202 and 240. Similarly, the comb structure 280 (FIG. 2a) represented by the conductive lines 281A, 281B, 281C, may be provided between the device levels 202, 240, thereby providing a very compact configuration of the test structure 270, which may thus reflect the device geometry in sophisticated device areas.

The semiconductor device 200 as shown in FIGS. 2a and 2b may be formed on the basis of appropriate manufacturing techniques for forming active regions, gate electrode structures, interlayer dielectric material systems and contact elements, as is also described above with reference to the device 100. Furthermore, the metallization system 240 may be formed on the basis of any appropriate process strategy.

Again referring to FIG. 2a, it should be appreciated that, in some illustrative embodiments, the active regions of the branches 260A, 260B may represent active regions of inverse conductivity type, which may be accomplished by using an appropriate masking regime when forming the active regions 202A . . . 202L. For example, the branch 260A may be provided so as to have a general N-type conductivity, wherein, for instance, the active regions 202B, 202F may be provided as transistor-like active regions, i.e., comprising drain and source regions and an intermediate channel region, as is discussed above with reference to the device 100, wherein the current flow may be controlled on the basis of conductive line or gate electrode structure 281B. In other cases, as also discussed above, the active regions 202B, 202B may be provided with a continuous conductive path implemented therein, thereby not requiring an additional control of the current flow. Similarly, the chain structure 260B may be provided in the form of a generally P-type conductive path in the associated active regions, wherein, also in this case, the active regions 202D, 202K may be provided in the form of transistor-type regions or continuously conductive regions, as discussed before.

Figure 2C:
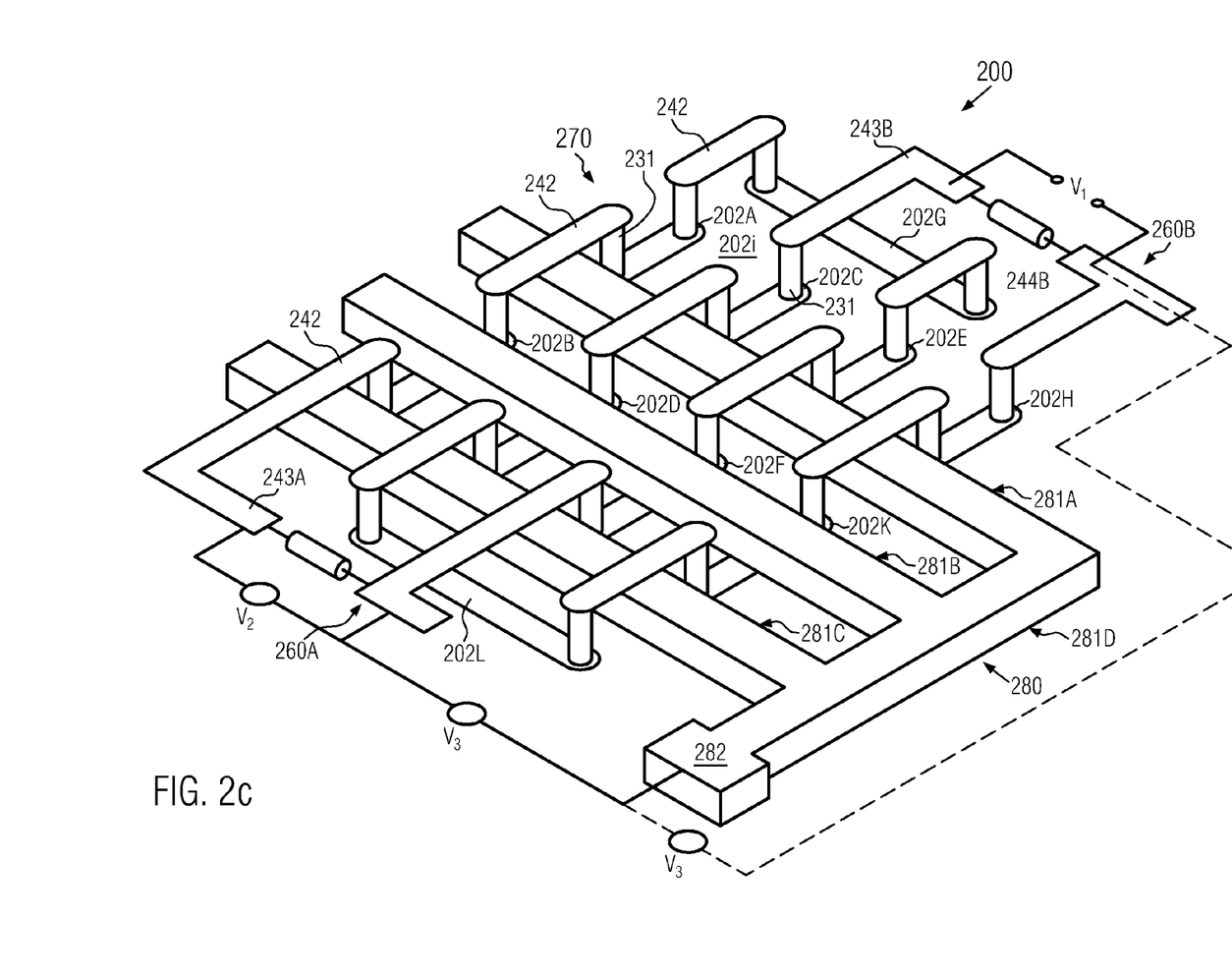
FIGS. 2c-2d schematically illustrate the test structure with various contact regimes in order to provide appropriate test voltages for obtaining the desired electrical measurement data, according to still further illustrative embodiments.

FIG. 2c schematically illustrates the test structure during operation, wherein a first test voltage $V_1$ is applied to the interconnect chain structure 260B, while a second test voltage $V_2$ is applied to the interconnect chain structure 260A. In this manner, a current flow may be established in the corresponding chain structures 260A, 260B, which may depend on the characteristics of any components within these structures and, in particular, the characteristics of the contact elements 231 and the contact resistivity to the metal regions 242 and the active regions, such as the region 202A, may contribute to the overall resistance value. In particular, any contact open circuit may be detected in the chains 260A, 260B, thereby enabling quantitative evaluation of the probability of creating contact failures in actual device areas. Moreover, by providing the chain structures 260A, 260B having different characteristics, for instance with respect to the type of doping in the corresponding active regions, information with respect to the contact technology in view of this difference may be obtained on the basis of the structure 270. Similarly, a test voltage $V_3$ may be applied to the comb structure 280 in combination with one or both of the voltages $V_1$, $V_2$, thereby also enabling the detection of any leakage paths between the comb structure 280 and any of the chain structures 260A, 260B. In this manner, any leakage currents between the comb structure 280 and any of the chain structures 260A, 260B may be determined. Similarly, a test voltage $V_3$ may be applied between the chain structures 260A, 260B, thereby enabling the detection of any leakage current paths that may have formed between these structures during the manufacturing process. Generally, a plurality of test measurement regimes may be applied, wherein the combination of the one or more chain structures 260A, 260B and the comb structure 280 may provide a plurality of interactions, while at the same time the high degree of similarity of device geometry in the test structure 270 with respect to actual device areas may also appropriately reflect the results of a complex manufacturing process, such as the process of forming complex contact elements. For example, at least the following measurement regimes are possible. The measurement of the resistance or any electrical parameter indicative thereof of the chain 260A, measurement of the resistance or any parameter indicative thereof of the chain 260B, any leakage current of the chain 260A and the comb structure 280, any leakage current paths between the chain structure 260B and the comb structure 280, and the leakage current paths formed between the chain structure 260A and the chain structure 260B.

Figure 2D:
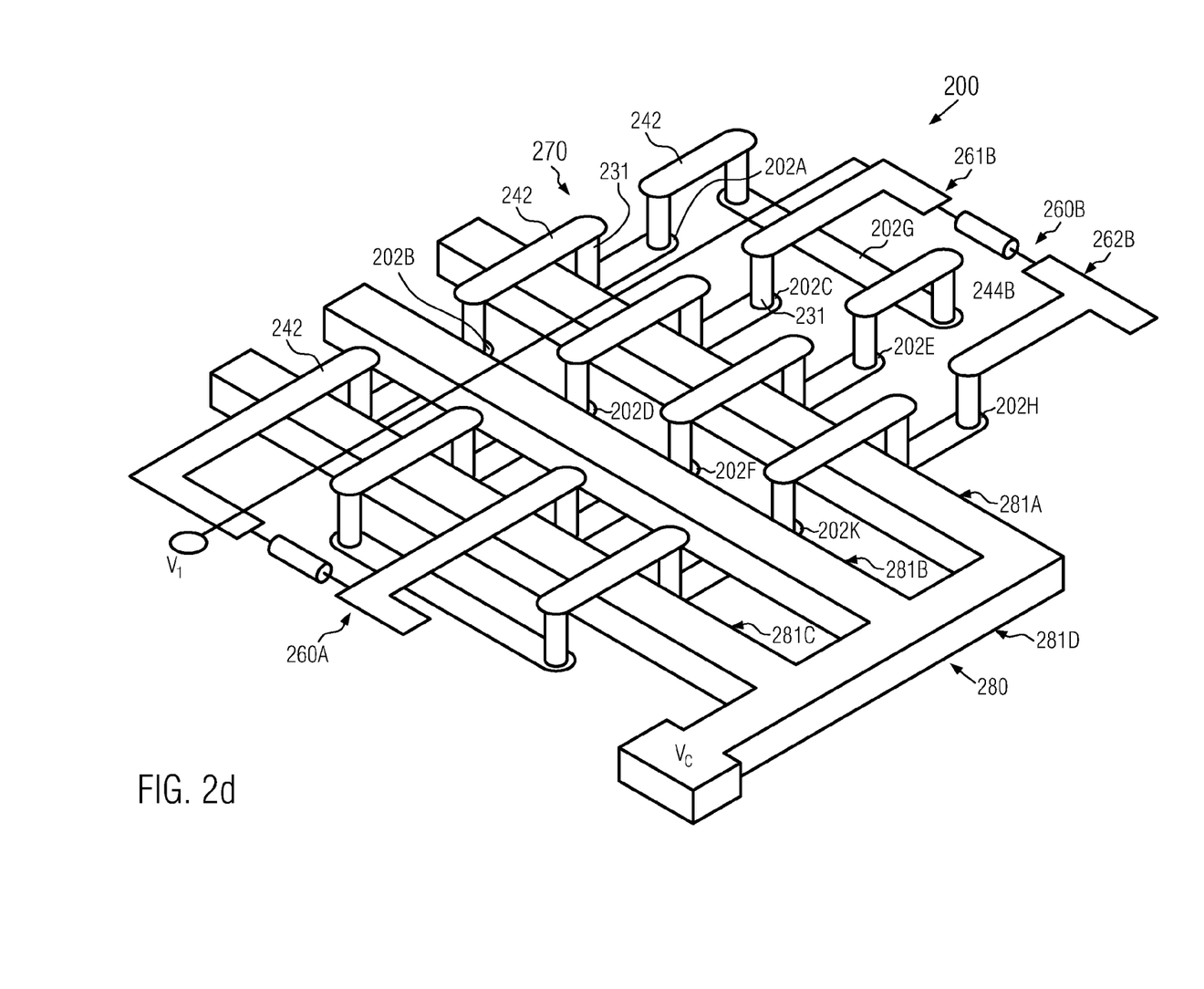

FIG. 2d schematically illustrates the device 200 according to further illustrative embodiments. As illustrated, the test structure 270 may be operated in a configuration in which the active regions 202B, 202F of the chain structure 260A may be provided in the form of a transistor-type configuration, as is also discussed above. In this case, the conductive line 281B may act as a gate electrode structure. Similarly, the active regions 202D and 202K in combination with the conductive line 281B may form a transistor configuration for the chain structure 260B. Moreover, generally, the "transistors" 202B, 202F on the one hand and the transistors 202D, 202K in combination with the gate electrode structure 281B, may be of inverse conductivity type. In this case, a test voltage such as the voltage $V_1$, may be applied concurrently to the chain structures 260A, 260B, for instance by internally connecting the corresponding contact, thereby enabling reducing the number of contact pads that may be required for connecting the test structure 270 with an external test equipment. Typically, corresponding test pads may require significant floor space in the test structure 270, which may thus result in significantly increased overall lateral dimensions of the structure 270. Moreover, in the configuration shown in FIG. 2d, the comb structure 280 may be connected to a control voltage $V_c$, which may thus be applied commonly to the transistor-like configurations in the active regions 202B, 202D, 202F, 202K. In the configuration as described above, the supply of the control voltage may thus result in a turning-on of the transistor-like configuration in and above the active regions 202B, 202F on the one hand, while resulting in a turning-off of the transistor-like configuration of the active regions 202D, 202K. Consequently, a conductive path may be established in the chain structure 260A unless a contact failure has occurred and hence the corresponding resistance may be determined, while, on the other hand, a conductive path in the chain structure 260B may be interrupted due to the transistor-like configurations in the active regions 202D, 202K. Upon changing the control voltage $V_c$, the conductive path in the chain 260A may be discontinued, while the transistors in the chain 260B may be turned on, thereby enabling the measurement of the corresponding series resistance in the chain 260B.

It should be appreciated that many other measurement strategies may be obtained on the basis of the switchable chains 260A, 260B, thereby providing a moderately high degree of freedom in selecting appropriate measurement data, while nevertheless reducing the required floor space of the structure 270.

As a result, the present disclosure provides manufacturing techniques, semiconductor devices and test structures in which the combination of one or more interconnect chain structures and a comb-like structure may result in a very space-efficient test configuration which may enable obtaining an increased amount of available measurement data compared to conventional strategies in which, typically, interconnect chain structures and comb-like structures are provided as individual test arrays. In this manner, very complex manufacturing processes may be evaluated, for instance in terms of buried channel leakage paths, contact open circuits, dielectric breakdown, gate leakage currents and the like, for sophisticated semiconductor devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
a first interconnect chain structure formed in a first device level and a second device level, said first interconnect chain structure comprising a first plurality of lower conductive regions formed in said first device level and a first plurality of upper conductive regions formed in said second device level and a first plurality of inter-level connections connecting said first plurality of lower conductive regions with said first plurality of upper conductive regions forming at least two parallel chain branches;
a second interconnect chain structure formed in said first and second device levels and comprising a second plurality of lower conductive regions formed in said first device level, a second plurality of upper conductive regions formed in said second device level and a second plurality of inter-level connections connecting said second plurality of lower conductive regions with said second plurality of upper conductive regions; and
a conductive comb structure formed between said first and second device levels and comprising a plurality of conductive lines crossing said first and second interconnect chain structures, wherein at least one of the at least two parallel chain branches of said first interconnect chain structure crosses a portion of the second interconnect chain structure.

2. The semiconductor device of claim 1, wherein said second interconnect chain structure comprises at least two parallel chain branches.

3. The semiconductor device of claim 1, wherein said first and second pluralities of lower conductive regions are formed in a semiconductor layer and are laterally delineated by an isolation region.

4. The semiconductor device of claim 3, wherein said first plurality of lower conductive regions comprise highly doped regions of a first conductivity type and wherein said second plurality of lower conductive regions comprise highly doped regions of a second conductivity type that differs from said first conductivity type.

5. The semiconductor device of claim 4, wherein at least one of said first plurality of lower conductive regions comprises a PN junction.

6. The semiconductor device of claim 5, wherein at least one of said conductive lines of said conductive comb structure is positioned above a channel region of said at least one of said first plurality of lower conductive regions.

7. The semiconductor device of claim 1, further comprising first contacts configured to supply a voltage individually to said first interconnect chain structure.

8. The semiconductor device of claim 1, further comprising second contacts configured to supply a voltage individually to said second interconnect chain structure.

9. The semiconductor device of claim 1, further comprising third contacts configured to supply a voltage individually to said conductive comb structure.

10. The semiconductor device of claim 6, further comprising a common contact structure configured to commonly supply a voltage to said first and second interconnect chain structures.

11. The semiconductor device of claim 1, wherein said first and second device levels are provided in a metallization system of said semiconductor device.

12. A test structure in a semiconductor device, the test structure comprising:
- a plurality of semiconductor regions formed in a semiconductor layer and being laterally delineated by an isolation region;
- an interlayer dielectric material system formed above said plurality of semiconductor regions and said isolation region;
- a plurality of conductive lines embedded in said interlayer dielectric material system and extending in parallel at least above said isolation region;
- a plurality of contact elements formed in said interlayer dielectric material system and connecting to said plurality of semiconductor regions; and
- a metallization system formed above said interlayer dielectric material system and comprising a plurality of metal lines connecting to said plurality of contact elements so as to form at least first and second independent interconnect chain structures that are oriented perpendicularly to said plurality of conductive lines, wherein said first interconnect chain structure comprises at least two parallel chain branches and at least one of said parallel chain branches crosses at least a portion of said second interconnect chain structure.

13. The test structure of claim 12, further comprising an interconnect line formed above said isolation region and embedded in said interlayer dielectric material system, wherein said interconnect line connects to each of said plurality of conductive lines so as to form a comb structure.

14. The test structure of claim 12, wherein said plurality of semiconductor regions, said plurality of contact elements and said plurality of metal lines form said at least first and second independent interconnect chain structures.

15. The test structure of claim 14, further comprising a contact regime that is configured to individually supply a voltage to each of said at least first and second independent interconnect chain structures.

16. A semiconductor device, comprising:
- a first interconnect chain structure formed in a first device level and a second device level, said first interconnect chain structure comprising a first plurality of lower conductive regions formed in said first device level and a first plurality of upper conductive regions formed in said second device level and a first plurality of inter-level connections connecting said first plurality of lower conductive regions with said first plurality of upper conductive regions forming at least two parallel chain branches, and first contacts configured to supply a voltage to said first interconnect chain structure;
- a second interconnect chain structure formed in said first and second device levels and comprising a second plurality of lower conductive regions formed in said first device level, a second plurality of upper conductive regions formed in said second device level and a second plurality of inter-level connections connecting said second plurality of lower conductive regions with said second plurality of upper conductive regions, and second contacts configured to supply a voltage to said second interconnect chain structure; and
- a conductive comb structure formed between said first and second device levels and comprising a plurality of conductive lines crossing said first and second interconnect chain structures, and third contacts configured to supply a voltage to said conductive comb structure, wherein at least one of the first interconnect chain branches crosses a portion of the second interconnect chain structure.

* * * * *